DIGITAL TO ANALOG COMPUTER CONVERTER

Filed March 16, 1960

INVENTOR.
ARVIN D. MCGREGOR
BY Whittemore
Hulbert & Belknap
ATTORNEYS.

United States Patent Office 3,354,449

Patented Nov. 21, 1967

3,354,449

DIGITAL TO ANALOG COMPUTER CONVERTER

Arvin D. McGregor, Birmingham, Mich., assignor, by mesne assignments, to Control Data Corporation, Minneapolis, Minn., a corporation of Minnesota

Filed Mar. 16, 1960, Ser. No. 15,419
21 Claims. (Cl. 340—347)

The present invention relates to converters and refers more particularly to a digital to analog converter wherein an analog voltage is generated by switching a measured charge onto a condenser in accordance with the pulses of a digital word.

As is well known, digital computer systems are based on the presence or absence of signals at a certain time. Analog computer systems are based on the magnitude of a signal at a particular time. Digital systems are in general the more accurate of the two while certain curve plotting and other devices will operate only with an analog input signal. Thus, both analog and digital computers are desirable for performing particular operations but are not compatible and cannot be used together without the use of a converter therebetween.

Therefore, it is an object of the present invention to provide a converter for use between a digital and analog system capable of accurate operation and requiring a minimum of precision components.

Another object is to provide a converter capable of accurate high speed operation.

Another object is to provide a converter wherein the time of sampling of an input signal by the converter is not critical.

More specifically it is an object to provide a converter wherein an analog voltage is generated by switching a measured charge onto a condenser in accordance with the pulses of a digital word.

Still more specifically it is an object to provide a digital to analog converter including a reference voltage capacitor in parallel with an operational amplifier, means for placing a regulated standard charge on the reference voltage capacitor, a voltage divider capacitor and switch means operable in response to clock pulses in a digital word to reduce the charge on the reference voltage capacitor by a predetermined factor and switch means and storage means operable to sample the charge on the reference voltage capacitor on occurrence of information bits in said digital word and store said sampled voltages in additive relation until the end of the digital word whereby an analog voltage level representative of the digital word is produced in said storage means.

Another object is to provide a converter as set forth above wherein the last-mentioned switching and storage means comprises a sampling switch operable on an information bit appearing in the digital word to sample the voltage on the reference voltage capacitor and an associated sampling capacitor in series with said switch and a storage capacitor, said storage capacitor being in parallel with a second operational amplifier, said sampling switch being operable to short circuit said sampling capacitor during the intervals between information bits in said digital word.

Another object is to provide a converter which is simple in construction, economical to manufacture and efficient in use.

Other objects and features of the invention will become apparent as the description proceeds, especially when taken in conjunction with the accompanying drawings illustrating a preferred embodiment of the invention, wherein.

With particular reference to the drawings, a preferred embodiment of the converter of the invention will now be described.

Figure 1:
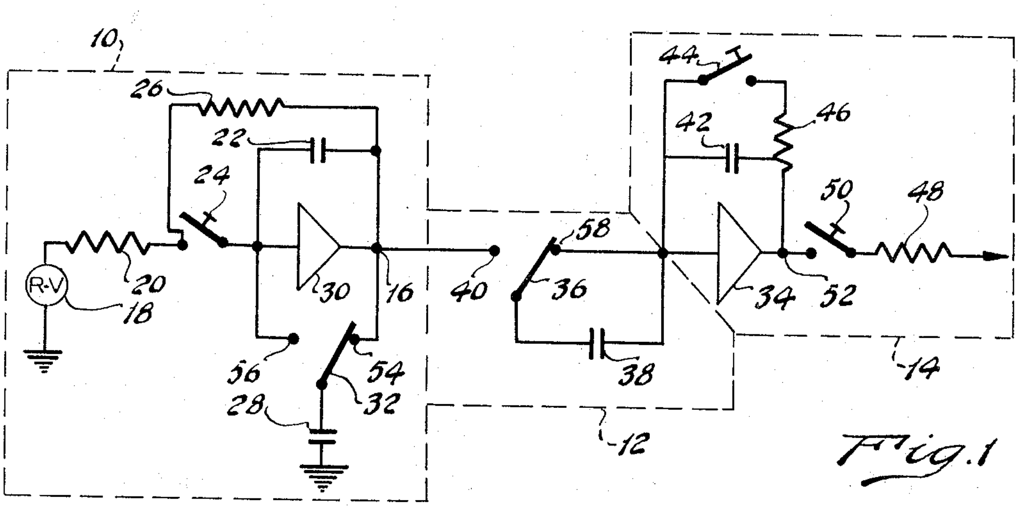
FIGURE 1 is a schematic representation of one embodiment of the invention.

As shown schematically in FIGURE 1, the converter of the invention comprises a reference voltage portion generally indicated 10, a switching portion 12, and a storage portion 14.

The reference voltage portion 10 of the converter operates to maintain a reference voltage at the junction 16 and on the capacitor 22, which is proportional in magnitude to the position of an information bit in a digital word as will later be explained. The switching portion 12 of the converter of the invention operates to sample the voltage at junction 16 at the time in the digital word during which an information bit is received. The storage portion 14 of the converter of the invention operates to receive the sample voltages from the switching portion 12 of the converter and to additively store the voltage sampled by the sampling portion during a complete digital word whereby a voltage, the magnitude of which is representative of the digital word, is produced for each word.

More specifically, the reference voltage portion of the converter of the invention comprises a source of reference voltage 18 which is chosen to have a magnitude representative of the most significant digit in a digital word, and a current limting resistor 20 to limit the current flow from the voltage source 18 during initial charging of the reference voltage storage capacitor 22.

The reference voltage portion of the converter also includes a reset or initial charge switch 24, which is operable before the start of a digital word to reset the voltage on reference voltage capacitor 22 to the value of the reference voltage source 18, which, as previously stated, is chosen to have a magnitude representative of the most significant digit in a digital word.

Resistor 26 is provided to add in the charging and discharging of reference voltage capacitor 22 and voltage divider capacitor 28, as shown in FIGURE 1. The reference voltage capacitor 22 is connected in parallel with a reference voltage operational amplifier 30 and the resistor 26.

The clock pulse switch 32 is also provided in the reference voltage portion of the converter and it is operable to switch the ungrounded side of the capacitor 28 between the ends of the operational amplifier 30 on the reception of each clock pulse in a digital word to reduce the charge on capacitor 22 by a predetermined amount, for instance, one-half of the charge thereon on the reception of each of the clock pulses, as will later be seen.

The operational amplifier 30 and a second operational amplifier 34 in the storage portion 14 of the converter of the invention are of the type which have the property of holding a constant voltage even though a substantial load may be imposed on the amplifier. The operational amplifier, in general terms, has the property of reversing the sign of an applied voltage and is extremely high gain, for example, by the factor of one thousand.

The sampling portion 12 of the converter illustrated comprises sampling switch 36 and sampling capacitor 38. The contact 40 of the sampling switch 36 is connected to the junction 16 in the reference voltage portion of the converter. In the usual position of the sampling switch 36 as illustrated, the sampling capacitor 38 is caused to be short circuited thereby, as shown in FIGURE 1. The sampling switch 36 is operated to connect with contact 40 on reception of an information bit during a digital word, as previously indicated. At this time the capacitor 38 and the storage capacitor 42 in the storage portion 14 of the converter have impressed across them the voltage present sample at junction 16 in the reference voltage portion of the converter during the reception of said information bit.

The storage portion of the converter includes the storage capacitor 42, the operational amplifier 34 in parallel with each other and also in parallel with a reset switch 44 and a current limit resistor 46, as illustrated in FIGURE 1. Capacitor 42 functions to additively store the voltages sampled by the sampling portion of the converter during a complete digital word. The operational amplifier functions in the well-known manner of an operational amplifier to permit the capacitor 42 to perform the additive storing of said sample voltages. The switch 44 and current limiting resistor 46 are provided to reset the storage capacitor 42 to a zero value after the occurrence of a complete digital word as will later be explained.

The storage portion 14 of the converter of the invention also includes the output switch 50. Switch 50 is closed at the end of a digital word to provide an output voltage which will be an analog voltage representative of the digital word input to the converter.

The over-all operation of the embodiment of the digital to analog converter of the invention illustrated in FIGURE 1 will now be considered. At the end of a previous digital word or before reception of any digital word, a voltage representative of the most significant digit in the digital word to be received by the converter is placed on the reference voltage capacitor 22 from the reference voltage source 18 on closing of the switch 24 for a short period.

Figure 2:
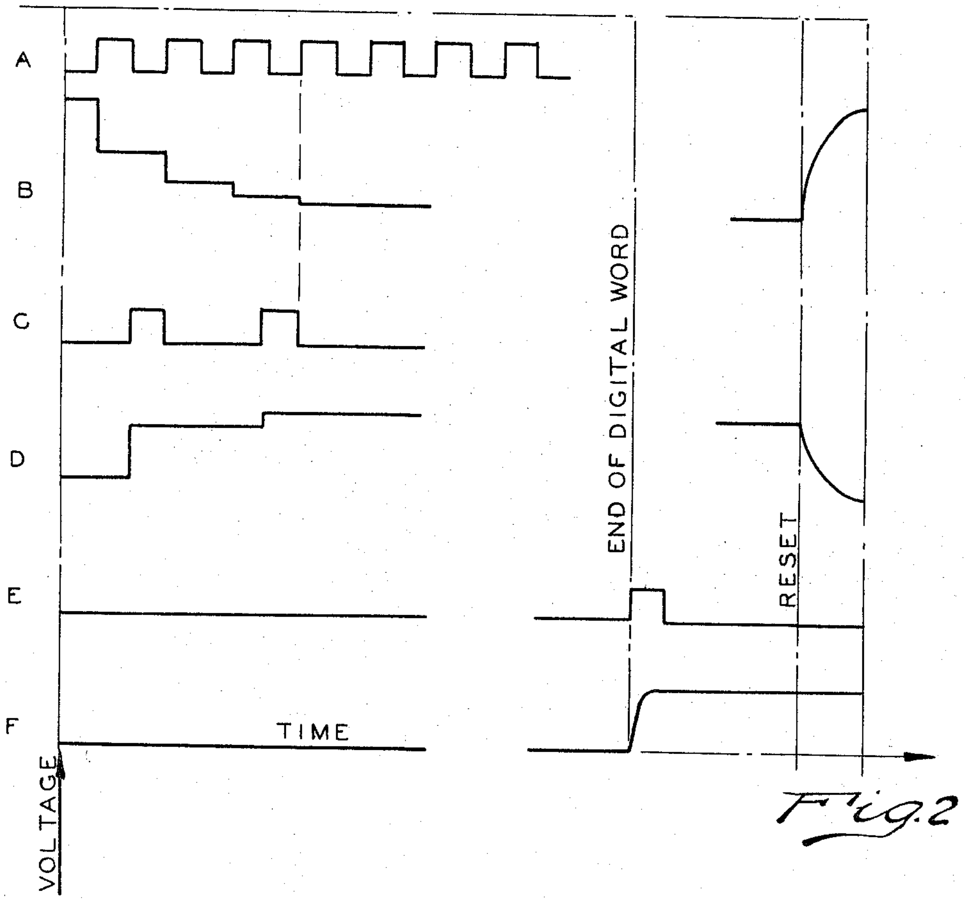
FIGURE 2 represents the signals present at particular points in the converter shown in FIGURE 1 during operation thereof.

The reference voltage placed on capacitor 22 is held at the reference level by means of the operational amplifier 30 until a clock pulse, several of which are indicated in FIGURE 2, Graph A, is received to energize switch 32 to change the connection of the ungrounded side of the capacitor 28 from the contact 54 to the contact 56. At this time the voltage stored by the capacitor 22 will be reduced by an amount proportional to the size of the capacitors 22 and 28 and, in the present instance, will be reduced by one-half of the voltage thereon after reception of each clock pulse in a digital word.

Thus, as the clock pulses of a digital word illustrated in Graph A are received, the switch 32 oscillates between the contacts 54 and 56 to provide at the junction 16 in the reference voltage portion of the converter a staircase form, as indicated in Graph B, FIGURE 2. Each step of the staircase wave form shown in Graph B represents a voltage half of that of the preceding step which represents the successive significant digits in a digital word.

During the reception of the digital word, the information bits therein will cause the switch 36 to oscillate between the contact 40 and the contact 58 whereby the successively smaller voltages at junction 16 in the reference voltage portion of the converter present between successive clock pulses wherein digital information bits, as shown in Graph C, are present will be impressed on both the sampling capacitor 38 and the storage capacitor 42 in series therewith. As previously indicated, after each voltage is sampled, the sampling capacitor 38 is shorted to provide for sampling of a subsequent voltage representative of a less significant digital information bit.

The storage capacitor 42, in cooperation with the operational amplifier 34 on the reception of each of the sample voltages acts to additively store said sample voltages and produces an increasing voltage at 52 in the storage portion of the converter, as indicated by the reverse staircase wave form indicated in Graph D, FIGURE 2.

At the end of a digital word, the switch 50 may be operated by an output pulse indicated in timed relation to the clock pulses on Graph E, FIGURE 2. The closing of switch 50 allows an output signal to be taken across resistor 48 which has a magnitude representative of the digital word received by the converter. This output is right in Graphs B and D of FIGURE 2.

At this time in the operation of the converter, the switches 44 and 24 may be closed to reset the converter in preparation for the reception of second digital word wherein the voltage on the capacitor 42 is thus returned to a zero value while the voltage on the capacitor 22 is returned to the value representative of the most significant bit of the digital word to be received, as indicated at the right in Graphs B and D of FIGURE 2.

Thus, it is seen that applicant has provided a converter which will operate accurately at high speed and in which the time of sampling is not significant since the voltage is held on the capacitors by the operational amplifier for an indefinite time. Furthermore, it will be noted that applicant has provided such converter through the use of a minimum number of precision components.

Also, while applicant has chosen to discuss a digital to analogous type converter into which serial information is placed, it will be evident to those skilled to the art that similar converters of both digital to analog and analog to digital types may be constructed according to applicant's disclosure adapted to receive both serial and parallel information.

The drawings and the foregoing specification constitue a description of the improved digital to analog computer in such full, clear, concise and exact terms as to enable any person skilled in the art to practice the invention, the scope of which is indicated by the appended claims.

What I claim as my invention is:

1. A converter for converting a digital word including clock pulses and information bits into an analog signal comprising means for receiving and storing a predetermined electrical signal, means for changing said predetermined electrical signal a measured amount in response to each clock pulse of a serially received digital word, means for sampling the changed electrical signal between clock pulses only in response to an information bit in the digital word, and separate means for combining and storing only the sample electrical signals during the digital word.

2. The structure as set forth in claim 1 wherein said means for receiving and storing a predetermined electrical signal comprises a reference capacitor and an operational amplifier connected in parallel.

3. The structure as set forth in claim 1 wherein said means for receiving and storing a predetermined electrical signal comprises a capacitor operable to store an electrical signal placed thereon, an operational amplifier connected in parallel with said capacitor to maintain the electrical signal on said capacitor at a predetermined value between clock pulses of a digital word, and a switch connected in series with said capacitor and operational amplifier, said switch being operable at the end of a digital word to connect the capacitor and operational amplifier to a reference signal source whereby the electric signal on said capacitor at the start of each digital word is the same.

4. The structure as set forth in claim 1 wherein said means for combining and storing the sample electrical signals during a digital word comprises a capacitor and an operational amplifier connected in parallel.

5. The structure as in claim 2 wherein said means for changing said predetermined electrical signal a measured amount in response to each clock pulse of a digital word includes a second capacitor having one side connected to ground, and a switch operable in response to clock pulses of the digital word to alternately connect the ungrounded side of the second capacitor to opposite sides of the reference capacitor whereby the electrical signal on the reference capacitor is reduced a predetermined amount in response to each clock pulse in a digital word.

6. The structure as set forth in claim 2 wherein said means for sampling the changed electrical signal in response to an information bit in the digital word includes a sampling capacitor and a switch normally connecting the opposite sides of said sampling capacitor and operable in response to the occurrence of an information bit in a digital word to connect the sampling capacitor to the means for receiving and storing a predetermined electrical signal whereby an electrical signal proportioned to the electrical signal present on said reference capacitor is present on said sampling capacitor.

7. A converter for converting a digital word including clock pulses and information bits into an analog signal comprising capacitor means for receiving and storing a predetermined electrical signal, means for changing said predetermined electrical signal a measured amount in response to each clock pulse of a serially received digital word, means for sampling the changed electrical signal between clock pulses only in response to an information bit in the digital word, and separate capacitor means for combining and storing only the sample electrical signals during the digital word.

8. A converter for converting a digital word including clock pulses and information bits into an analog signal comprising means for receiving and storing a predetermined electrical voltage, means for reducing said predetermined electrical voltage a measured amount in response to each clock pulse of a serially received digital word, means for sampling the reduced electrical voltage between clock pulses only in response to an information bit in the digital word, and means for combining and storing only the sample electrical voltages during the digital word.

9. A converter for converting a digital word including clock pulses and information bits into an analog signal comprising capacitor means for receiving and storing a predetermined electrical voltage, means for reducing said predetermined electrical voltage by one-half in response to each clock pulse of a serially received digital word, means for sampling the reduced electrical voltage between clock pulses only in response to an information bit in the digital word, and capacitor means for combining and storing only the sample electrical signals during the digital word.

10. A converter for converting a digital word including clock pulses and information bits into an analog signal comprising means for receiving and storing a predetermined electrical signal, means for changing said predetermined electrical signal a measured amount in response to each clock pulse of a serially received digital word, means for sampling the changed electrical signal between clock pulses only in response to an information bit in the digital word, and separate means for combining and storing only the sample electrical signals during the digital word, and switch means operable to provide an analog output from said means for storing the sample electrical signals at the end of each digital word.

11. A converter for converting a digital word including clock pulses and information bits into an analog signal comprising a source of reference voltage, a reference voltage capacitor and an operational amplifier in parallel, switch means operable to connect the source of reference voltage to said reference voltage capacitor to charge said reference voltage capacitor to a voltage representative of the most significant digit of a digital word, capacitor and switch means operatively associated with said reference voltage capacitor to reduce the reference voltage on said reference voltage capacitor a predetermined amount in response to each clock pulse in a serially received digital word, a sampling switch and capacitor operably associated with said reference voltage capacitor to sample the voltage present on the reference voltage capacitor between clock pulses only in response to an information bit in the digital word, storage means including a storage capacitor and an operational amplifier operably associated with said sampling switch and capacitor to receive, combine and store only voltages proportional to each voltage sampled during a digital word, and switch means operable to provide an analog output from said storage means at the end of each digital word.

12. A converter for converting a digital word including clock pulses and information bits into an analog signal comprising means for periodically producing a series of electric reference signals having distinct magnitudes corresponding to different significant positions in a binary code and spaced in time in accordance with clock pulses of a binary coded digital word, means selectively connected to the signal producing means for developing distinct sample electric signals proportional to particular ones of the reference signals only in response to an information bit in a similar significant position in a serially received binary coded digital word, and separate means connected to the sample electric signal developing means for adding and storing only said distinct sample electric signals until the end of the digital word to provide an analog signal representative of the digital word.

13. A converter for converting a digital word including clock pluses and information bits into an analog signal comprising means for periodically producing reference signals having distinct magnitudes corresponding to different signifiicant positions in a binary code and spaced in time in accordance with clock pulses of a binary coded digital word comprising a source of reference voltage of fixed predetermined magnitude, a first resistor and a switch in series with the reference voltage source, a first capacitor and an operational amplifier in parallel with each other and in series with said voltage source, first resistor and switch, a second resistor in parallel with the switch and the parallel first capacitor and operational amplifier, a second capacitor and a second switch for alternately connecting the second capacitor between ground and opposite sides of the first capacitor in response to the clock pulses of the binary coded digital word, means selectively connected to the signal producing means for developing distinct sample electric signals proportional to particular ones of the reference signals only in response to an information bit in a similar significant position in a serially received binary coded digital word, and means connected to the sample electric signal developing means for adding and storing only said distinct sample electric signals until the end of the digital word to provide an analog signal representative of the digital word.

14. Structure as claimed in claim 13 wherein said means for developing sample electric signals comprises a third capacitor and a third switch connected thereto, operable to connect the third capacitor to the junction of the operational amplifier and first capacitor opposite said first switch only in response to an information bit in a binary coded word and to provide a low resistance path between the plates of the third capacitor at all other times.

15. Structure as claimed in claim 14 wherein said means for adding and storing the sample signals comprises an operational amplifier and a fourth capacitor in parallel and permanently connected to the third capacitor at one junction therebetween, and a third resistor and fourth switch in series with each other and in parallel with the fourth capacitor.

16. A converter for converting a digital word including clock pulses and information bits into an analog signal comprising a source of reference voltage, a voltage storage signal comprising a source of reference voltage, a voltage voltage, whereby said voltage storage means is charged to a voltage representative of the most significant position of a digital word, means associated with the voltage storage means to reduce the voltage on the voltage storage means an amount representative of one position in a digital word in response to each clock pulse in a serially received digital word, sampling means including a sampling switch responsive only to an information bit in the digital word for sampling the voltage present in the voltage storage meains between clock pulses of the digital word, and separate storage means connected to the sampling means for receiving, combining and storing only the voltages sampled during a digital word to provide an analog signal representative of the digital word.

17. A converter for converting a digital word including clock pulses and information bits into an analog signal comprising means for receiving and storing a predetermined electrical signal including a reference capacitor and an operational amplifier connected in parallel, means for changing said predetermined electrical signal a measured amount in response to each clock pulse of a serially received digital word, means for sampling the changed electrical signal between clock pulses only in response to an information bit in the digital word including a sampling capacitor and a switch normally connecting the opposite sides of said sampling capacitor and operable in response to the occurrence of an information bit in a digital word to connect the sampling capacitor to the means for receiving and storing a predetermined electrical signal whereby an electrical signal proportional to the electrical signal present on said reference capacitor is present on said sampling capacitor, and separate means for combining and storing the sample electrical signals during the digital word, including a storage capacitor connected in series with said sampling capacitor operable to receive an electrical signal proportional to the signal sampled by the signal sampling means in response to an information bit in the digital word, an operational amplifier connected in parallel with said storage capacitor operable to cause said capacitor to store only the sampled signals of a digital word received thereby, and switch means operable to discharge said storage capacitor at the end of a digital word.

18. A converter for converting digital words including clock pulses and information bits into an analog signal comprising a source of reference voltage, a reference voltage capacitor, switch means operable to connect the source of reference voltage to said reference voltage capacitor to charge said reference voltage capacitor to a voltage representative of the most significant digit of a digital word, capacitor and switch means operatively associated with said reference voltage capacitor to reduce the reference voltage on said reference voltage capacitor a predetermined amount in response to each clock pulse in a serially received digital word, a sampling switch and capacitor operably associated with said reference voltage capacitor to sample the voltage present on the reference voltage capacitor between clock pulses only in response to an information bit in the digital word, storage means including a storage capacitor operably associated with said sampling switch and capacitor to receive, combine and store voltages proportional to only each voltage sampled during a digital word to provide an analog signal representative of the digital word at the end of each digital word.

19. A converter for converting a digital word including clock pulses and information bits into an analog signal comprising means for periodically producing a series of electric reference signals having distinct substantially constant magnitudes between clock pulses of the digital word corresponding to different significant positions in a binary code, sample electric signal developing means positioned adjacent and selectively connectable to the signal producing means only in response to information bits in a serially received binary coded digital word for sampling the distinct electric signals produced only at the time of the information bits in the digital word and separate means connected to the sample electric signal developing means for adding and storing only said distinct sample electric signals until the end of the digital word to provide an analog signal representative of the digital word.

20. Structure set forth in claim 19 wherein the means for producing a series of electric reference signals having magnitudes corresponding to different significant positions in a binary code comprises an operational amplifier and capacitor in parallel for receiving and storing an electric signal representative of the most significant digit in a binary code, a second capacitor one side of which is connected to ground and means for alternately connecting the other side of the second capacitor to the opposite sides of the capacitor and amplifier in parallel in response to the digital word clock pulses.

21. Structure as set forth in claim 19 wherein the means for developing sample electric signals in response to an information bit in a digital word comprises a third capacitor and switch means for connecting the capacitor in series with the parallel combination of the capacitor and amplifier in response to an information bit in a digital word and for otherwise connecting the sides of the capacitor together during the digital word.

References Cited

UNITED STATES PATENTS

| | | | |
|---|---|---|---|
| 3,078,451 | 2/1963 | Sable | 340—347 |
| 3,111,649 | 11/1963 | Carroll | 340—173 |
| 3,193,798 | 7/1965 | Palmer | 340—31 |
| 2,630,481 | 3/1953 | Johnson | 340—347.1 |
| 2,803,815 | 8/1957 | Wulfsberg | 340—347.1 |
| 2,832,070 | 4/1958 | Bateman | 340—347.1 |
| 2,832,887 | 4/1958 | Kirschner | 320—1 X |
| 2,843,736 | 7/1958 | Huntley | 320—1 X |
| 3,030,618 | 4/1962 | Nilsson | 340—347 |
| 2,729,812 | 1/1956 | Jahn | 340—347.1 |
| 2,817,704 | 12/1957 | Huntly | 340—347.1 |
| 2,941,196 | 6/1960 | Raynsford | 340—347.1 |
| 2,994,825 | 8/1961 | Anderson | 340—347.1 |
| 3,051,938 | 8/1962 | Levy | 340—347 |

MAYNARD R. WILBUR, *Primary Examiner.*

L. SRAGOW, T. W. FEARS, *Examiners.*

K. R. STEVENS, J. H. WALLACE, *Assistant Examiners.*